United States Patent [19]
Shirakawa

[11] Patent Number: 5,768,697
[45] Date of Patent: *Jun. 16, 1998

[54] RADIO RECEIVER SELECTING BROADCAST FREQUENCIES BASED UPON STORED TIME DATA

[75] Inventor: Hiroshi Shirakawa, Tokyo, Japan

[73] Assignee: Sony Corporation, Tokyo, Japan

[*] Notice: The term of this patent shall not extend beyond the expiration date of Pat. No. 5,628,061.

[21] Appl. No.: 824,827

[22] Filed: Mar. 26, 1997

Related U.S. Application Data

[62] Division of Ser. No. 431,745, May 1, 1995.

[30] Foreign Application Priority Data

May 17, 1994 [JP] Japan .................................. 6-127003

[51] Int. Cl.$^6$ .................................................. H04B 1/18
[52] U.S. Cl. ................................... 455/181.1; 455/186.1
[58] Field of Search ........................ 455/181.1, 184.1, 455/185.1, 186.1, 186.2, 154.1, 436, 422, 260; 368/13, 47, 10, 21

[56] References Cited

U.S. PATENT DOCUMENTS

5,101,508 3/1992 Owaki .................................. 455/186.1
5,628,061 5/1997 Shirakawa .......................... 455/181.1

*Primary Examiner*—Nguyen Vo
*Attorney, Agent, or Firm*—Jay H. Maioli

[57] ABSTRACT

A radio receiver capable of receiving world wide shortwave broadcasting programs is constructed of a phase-locked loop circuit, a standard time generating circuit, a memory, a timer unit, and a controller. The phase-locked loop circuit includes a frequency dividing circuit and performs a frequency conversion of a received signal by changing a frequency dividing ratio of the frequency dividing circuit. The standard time generating circuit counts the Greenwich standard time. A shortwave broadcasting service area is subdivided into a plurality of service ares based upon time difference data corresponding to the Greenwich standard time produced from the standard time generating unit. The memory stores therein a plurality of frequency data receivable within an area of the plural set areas. The timer unit counts local time obtained by correcting the Greenwich standard time derived from the standard time generating unit based on the time difference data from the memory. The controller selectively reads the frequency data from the memory based on the time difference data used when the local time is set to the timer unit, and then set the frequency dividing ratio of the phase-locked loop circuit based on the read frequency data.

8 Claims, 6 Drawing Sheets

FIG.2

| TIME DIFFERENCE DATA JISA | PLACE NAME DATA PLCNM | NAME OF PLACE | ZONE |
|---|---|---|---|
| 0 | LONDON | LONDON, LISBON | EUROPE/ WEST AFRICA |
| +1 | C.EURO | CENTRAL EUROPE | |
| +2 | CAIRO | CAIRO, ATHENS | MIDDLE EAST/ EAST AFRICA |
| +3 | JEDDA | JEDDA, NAIROBI | |
| +4 | DUBAI | DUBAI | |
| +5 | KARACH | KARACH | |
| +6 | DHAKA | DHAKA | ASIA/ OCEANIA |
| . | | | |
| . | | | |
| +9 | TOKYO | TOKYO, SOUL | |
| . | | | |
| . | | | |
| +12 | AUKLND | AUKLAND, FIJI | |
| −11 | SAMOA | SAMOA | AMERICA |
| −10 | HAWAII | HAWAII, TAHICHI | |
| . | | | |
| . | | | |
| −3 | RIO | RIODE JANEIRO | |
| −2 | FN.ISL | FERNANDINA ISLAND | |
| −1 | AZORES | AZORES ISLANDS | EUROPE/ WEST AFRICA |

FRQTBL FREQUENCY TABLE

FIG. 3

| BROADCASTING STATION / ZONE | RADIO JAPAN N (FREQUENCY) | BBC N (FREQUENCY) | VOA N (FREQUENCY) |
|---|---|---|---|
| ASIA/ OCEANIA | 3 6 5 2 (17810)<br>2 4 5 3 (11815)<br>2 0 4 0 (9750)<br>2 4 3 8 (11740)<br>2 4 5 8 (11840) | 1 5 2 6 (7180)<br>2 4 8 1 (11955)<br>3 1 4 6 (15280)<br>4 4 3 3 (21715)<br>2 0 3 8 (9740) | 2 4 4 2 (11760)<br>3 1 4 8 (15290)<br>3 6 3 7 (17735)<br>3 6 5 4 (17820)<br>1 3 1 2 (6110) |
| AMERICA | 1 2 8 2 (5960)<br>2 0 3 5 (9725)<br>1 3 1 4 (6120)<br>3 1 6 0 (15350)<br>2 0 2 5 (9675) | | |
| EUROPE/ WEST AFRICA | 1 5 4 1 (7255)<br>1 3 1 5 (6125)<br>1 2 8 5 (5975)<br>1 5 3 6 (7230)<br>2 4 7 5 (11925) | | |
| MIDDLE EAST/ EAST AFRICA | 3 1 6 6 (15380)<br>4 4 3 0 (21700)<br>2 4 7 6 (11930)<br>3 6 5 4 (17820)<br>2 0 2 5 (9675) | | |

FRQTBL FREQUENCY TABLE

RADIO RECEIVER SELECTING BROADCAST FREQUENCIES BASED UPON STORED TIME DATA

This application is a division of application Ser. No. 08/431,745 filed May 1, 1995.

BACKGROUND

1. Field of the Invention

The present invention relates to a radio receiver. More specifically, the present invention relates to a synthesizing type radio receiver.

2. Background of the Invention

A shortwave broadcast is widely utilized as international broadcasting service since short wave signals can be transmitted to distant places due to characteristics of this short electro-magnetic wave. However, since wave propagation conditions of a shortwave broadcast are temporally varied, various broadcasting hours and frequencies are employed in connection with broadcasting service areas. As a result, users or listeners of shortwave radio receivers should check the broadcasting frequencies relevant to own regions from frequency tables and the like, and should adjust the receiving frequencies in connection with the broadcasting hours to receive the desired shortwave broadcasting channel.

However, very heavy work loads would be given to users when investigation should be taken to the frequencies of the broadcasting stations or channels available in the area where they are present by using the frequency tables, and furthermore the receiving frequencies of the radio receivers should be adjusted so as to receive the desired shortwave broadcasting programs.

Under such circumstances, one possible solution is conceivable. That is, when radio receivers are assembled and delivered from factories, the optimum receiving frequencies for the shortwave broadcasting stations may be preset with respect to each of radio destination places. However, in this case, the complex receiving frequency adjustments are necessarily required for the radio receivers assembled in the factory. Accordingly, the total manufacturing or assembling steps would be increased in the manufacturers.

Also, there are other possibilities that when a user visits foreign countries with taking a shortwave radio receiver, the receiving frequencies of the shortwave broadcasting stations are completely different from the country to the country, for instance, from U.S.A. to Europe. In this case, even when the optimum receiving frequencies are preset for one destination country in the factory, if the receivable frequency of the shortwave broadcasting station is shifted from this optimum preset frequency, the meeds to preset this receivable frequency manually.

SUMMARY OF THE INVENTION

It is therefore an object of the present invention to provide a radio receiver which resolves the above-mentioned problem.

According to one aspect of the present invention, there is provided a radio receiver including a phase-locked loop circuit, a standard time generating circuit, a memory, a timer unit, and a controller. The phase-locked loop circuit includes a frequency dividing circuit and performs a frequency conversion of a received signal by changing a frequency dividing ratio of the frequency dividing circuit. A broadcasting service area is subdivided into a plurality of service areas based upon time difference data corresponding to the Greenwich standard time. The memory stores therein a plurality of frequency data receivable within an area of the plural set areas. The timer unit sets therein local time. The controller reads the frequency data from the memory based on the time difference data between the Greenwich standard time and the local time set to the timer unit, and also sets the frequency dividing ratio of the frequency dividing circuit of the phased-locked loop circuit based on the read frequency data.

According to another aspect of the present invention, there is provided a radio receiver capable of receiving a shortwave broadcasting program includes a phase-locked loop circuit, a standard time generating circuit, a memory, a timer unit, and a controller. The phase-locked loop circuit includes a frequency dividing circuit and performs a frequency conversion of a received signal by changing a frequency dividing ratio of the frequency dividing circuit. The standard time generating circuit counts the Greenwich standard time. A shortwave broadcasting service area is subdivided into a plurality of service areas based upon time difference data corresponding to the Greenwich standard time produced from the standard time generating unit. The memory stores therein a plurality of frequency data receivable within an area of the plural set areas. The timer unit counts local time obtained by correcting the Greenwich standard time derived from the standard time generating unit based on the time difference data from the memory. The controller selectively reads the frequency data from the memory based on the time difference data used when the local time is set to the timer unit, and then set the frequency dividing ratio of the phase-locked loop circuit based on the read frequency data.

In accordance with the radio receiver of the present invention, even when the user is located in any areas in the world, the user sets the local time to change the frequency dividing ratio of the frequency dividing circuit employed in the phase-locked loop circuit based on this set local time. Accordingly, the frequencies receivable within an area covering this local area can be automatically set. As a result, no such cumbersome frequency setting work employing of frequency tables is required.

BRIEF DESCRIPTION OF THE DRAWINGS

The above-described object and other features of the present invention are explained in the following description, taken in connection with the accompanying drawings, in which.

DESCRIPTION OF THE INVENTION

Referring now to the drawings, an arrangement of a radio receiver according to the present invention will be described in detail.

Figure 1:
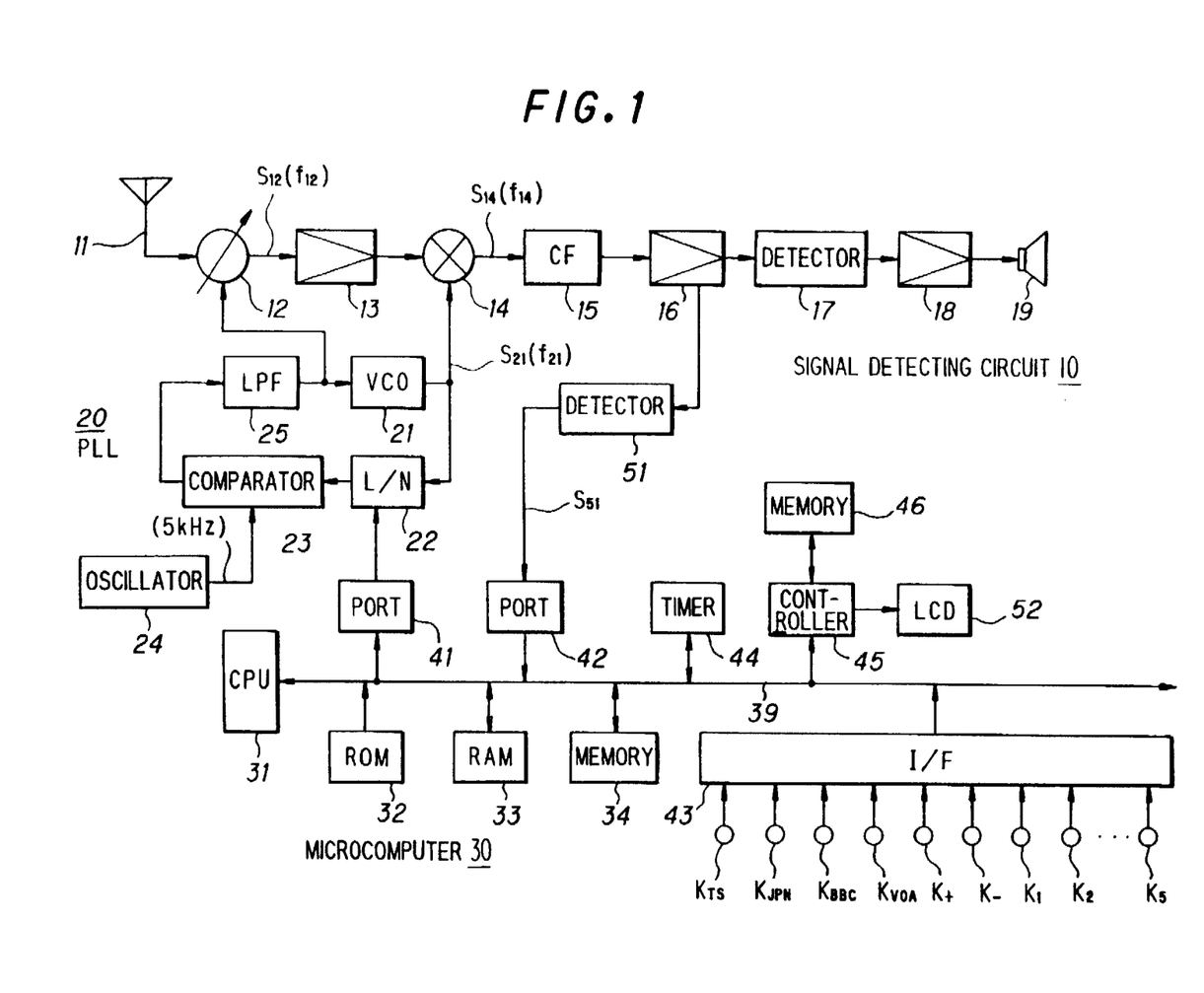
FIG. 1 is a schematic block diagram for representing an arrangement of a radio receiver according to an embodiment of the present invention.

In FIG. 1, there is shown a block diagram for indicating an arrangement of a radio receiver according to an embodiment of the present invention.

The radio receiver shown in FIG. 1 is capable of selecting, for instance, the Radio Japan, BBC, and VOA (Voice of America) as shortwave broadcasting programs. In the below-mentioned embodiment, the shortwave broadcasting service area is subdivided into such four zones as Europe and West Africa, Middle East and East Africa, Asia and Oceania, and America. Further, in the following description, a "time difference" corresponds to such a time difference with respect to the UTC time (Greenwich Mean Time).

In FIG. 1, in a signal detecting circuit 10 arranged in a synthesizing type, a signal received from an antenna 11 is supplied to an electronic tuning type antenna tuning circuit 12, so that a broadcasting signal S12 having a desired frequency f12 is derived.

This broadcasting signal S12 is supplied through a radio frequency amplifier 13 to a mixer circuit 14, and also a signal S21 having a frequency f21 is derived from a VCO (voltage-controlled oscillator) 21. This frequency is indicated by an equation (1) as follows:

$$f21 = f12 + f14 \text{ [kHz]} \quad (1)$$

wherein symbol "f14" indicates an intermediate frequency, is set to, e.g., f14=450 kHz. Then, this oscillator signal S21 is supplied as a local oscillator signal to the mixer circuit 14, so that the broadcasting S12 is frequency-converted into an intermediate frequency signal S14 (intermediate frequency f14).

Furthermore, this intermediate frequency signal S14 is supplied through an amplifier 16 and a ceramic filter 15 for constituting an intermediate frequency filter to an AM detecting circuit 17, so that an audio signal contained in this intermediate frequency signal is demodulated. The demodulated audio signal is supplied through an amplifier 18 to a speaker 19, and then sound is outputted from this speaker 19. A detecting circuit 51 is connected to the above-described amplifier 16. The detecting circuit 51 outputs a receiving detecting signal S51 which indicates whether or not the receiving level of the receiving signal S12 is higher than, or equal to a predetermined value.

In this case, a PLL (Phase Locked Loop) circuit 20 is composed of the VCO 21 with circuits 22 to 25. That is, the signal S21 outputted from the VCO 21 is supplied to a variable frequency dividing circuit 22 so that the frequency of this signal S21 is divided into a frequency of 1/N. Then, this frequency dividing signal from the circuit 22 is supplied to a phase comparing circuit 23, and such an oscillator signal having a reference frequency, e.g., 5 kHz is outputted from an oscillator circuit 24. The oscillator signal having this reference frequency of 5 kHz is supplied to a comparator circuit 23, and a comparison result outputted from this comparator circuit 23 is supplied through a low-pass filter 25 to the VCO 21 as a control voltage thereof. An output voltage from the filter 25 is supplied as a channel selecting voltage to the tuning circuit 12.

Consequently, since the frequency of the frequency divided signal outputted from the frequency dividing circuit 22 is equal to that of the oscillator signal outputted from the oscillator circuit 24 under steady state, the frequency f21 of the oscillator signal S21 at this time is given by the following equation (2):

$$f21 = N \times 5 \text{ [kHz]} \quad (2).$$

From the above-described equations (1) and (2), the following relationship is given:

$$\begin{aligned} f12 &= f21 - f14 \\ &= N \times 5 - 450 \text{ [kHz]}. \end{aligned}$$

Accordingly, when the frequency dividing ratio N is varied by "1" between 550 and 6090, since the local oscillation frequency f21 is changed between 2,750 kHz and 30,450 kHz by an interval of 5 kHz, the receiving frequency f12 is varied in such a frequency step of 5 kHz within a frequency range between 2,300 kHz and 30,000 kHz, and also in correspondence with the frequency dividing ratio N.

Furthermore, a reference numeral 30 represents a system controller composed of a microcomputer. A reference numeral 31 denotes a CPU, a reference numeral 32 denotes a ROM (read-only memory) for storing therein various sorts of process routines, and a reference numeral 33 indicates a RAM (random access memory) used to a work area. A reference numeral 34 denotes a memory for storing various data. These memories 32 as 34 are connected via a system bus 39 to the CPU 31.

Figure 2:
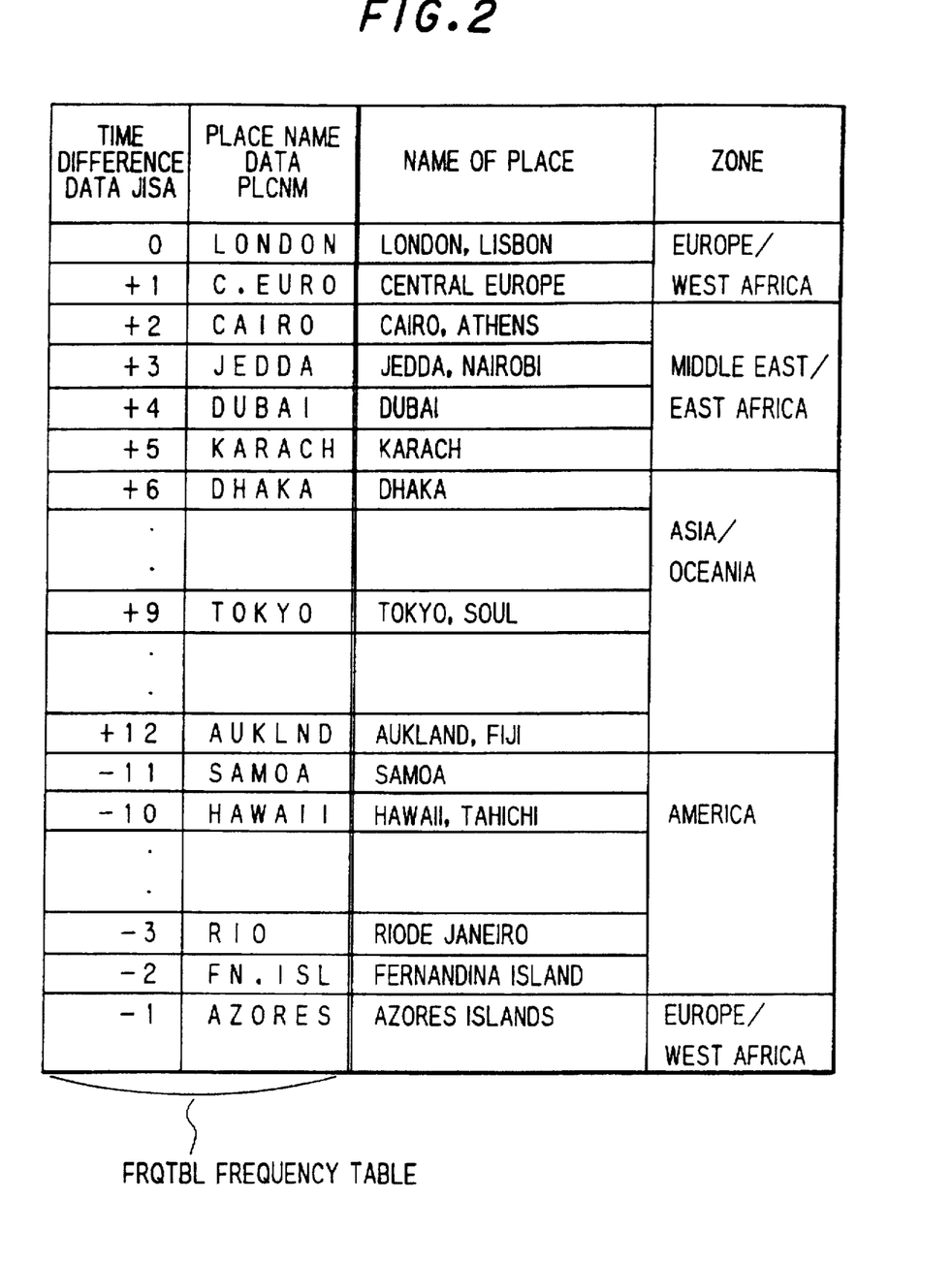
FIG. 2 represents a time difference table according to the embodiment of the present invention.

In this case, for instance, a time difference table JSTBL shown in FIG. 2 is stored in the ROM 32. This time difference table JSTBL contains 24 data columns corresponding to each of time differences for 1 hour. Into these data columns, the time difference data JISA for indicating that the time difference is equal to 0 to +12, −11 to −1 hour are stored, and furthermore, place-name data PLCNM are written which show names of typical places corresponding to these time differences.

It should be understood that although the "place name" and the "zone" recited on the right side of the table JSTBL are not contained in the data table JSTBL, they are indicated for reference purposes. The "name of place" indicate names of places corresponding to the data JISA and PLCNM, whereas the "zone" represents a place belonging to such a subdivided zone when the shortwave broadcasting service area is subdivided into four zones.

Figure 3:
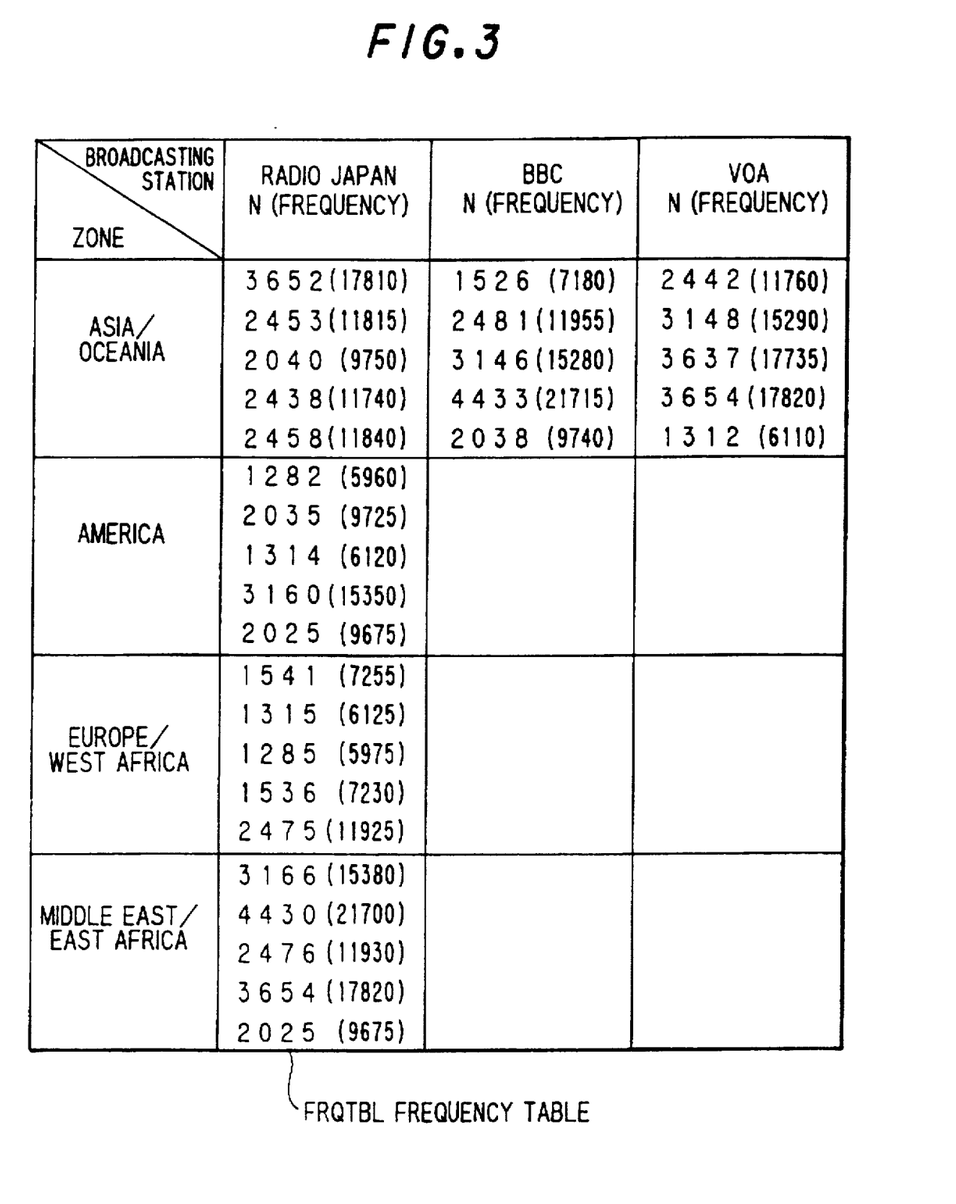
FIG. 3 indicates a frequency table according to an embodiment of an present invention.

In addition, for example, a frequency table FRQTBL shown in FIG. 3 is restored in the ROM 32. This frequency table FRQTBL contains 5 sets of frequency data about the Radio Japan, B.B.C. (British Broadcasting Corporation), and VOA (Voice of America) broadcasting programs receivable in each of the above-described four zones with respect to each of these three broadcasting stations. It should be noted in this embodiment that the frequency dividing ratio "N" of the frequency dividing circuit 22 has been stored as the frequency data stored in the ROM 32, and numerals indicated within parentheses denote the receiving frequency f12 corresponding to this frequency dividing ratio N.

Figure 4:
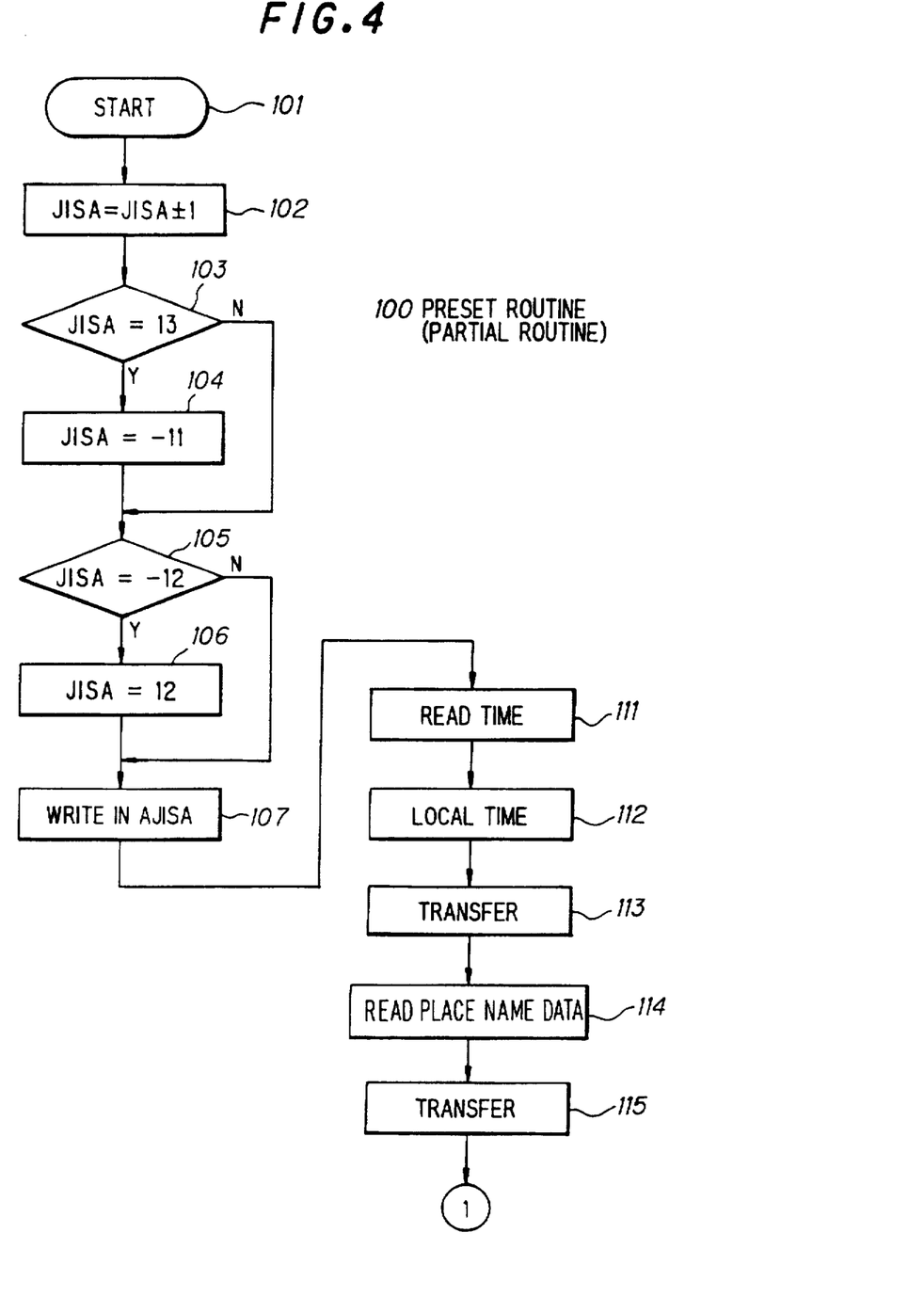
FIG. 4 is a flow chart for explaining selection/display operations of present time.
Figure 5:
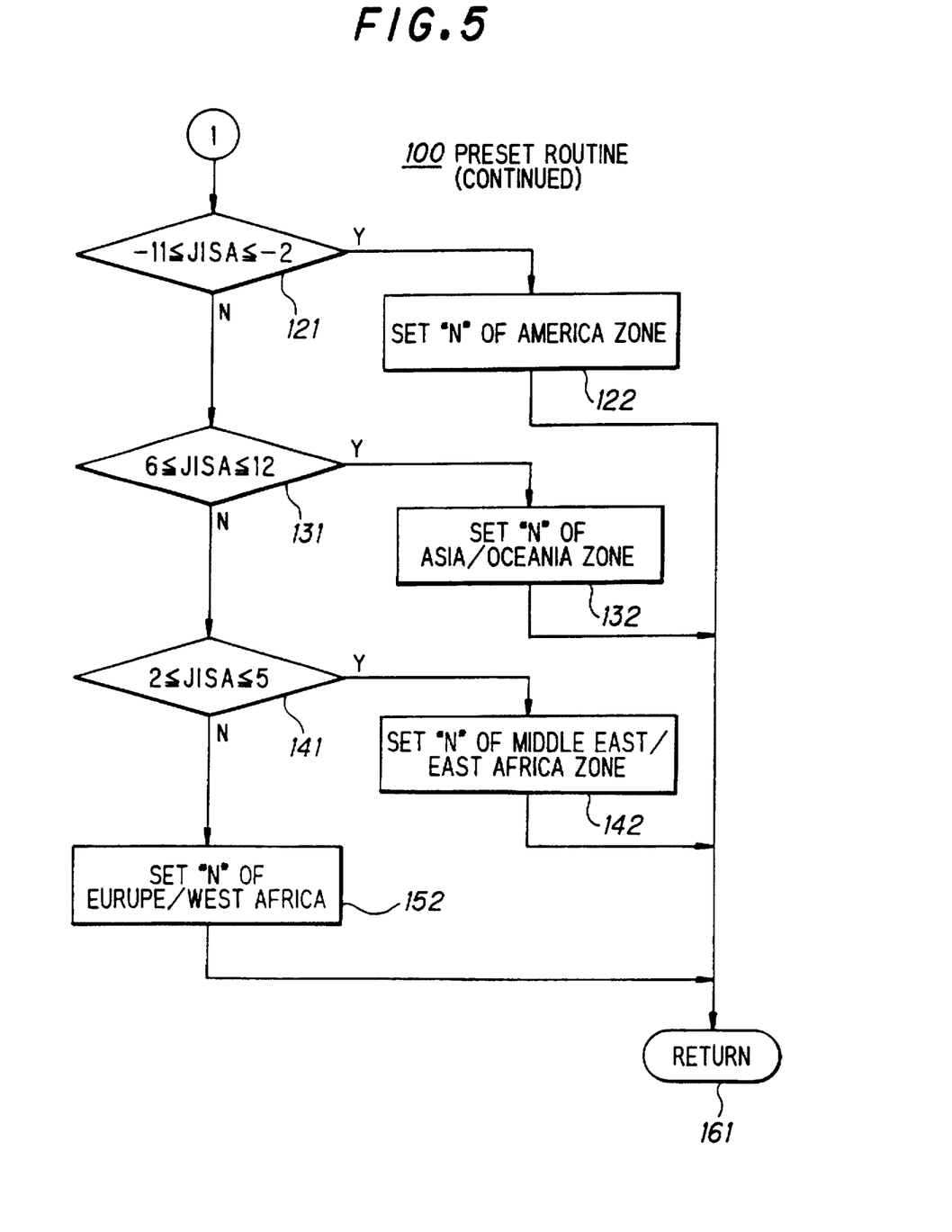
FIG. 5 is a flow chart for explaining a present operation of broadcasting stations.

As a portion of the process routine, for instance, a preset routine 100 shown in FIG. 4 and FIG. 5 is stored in the ROM 32.

Moreover, the memory 34 may be constructed of such a ROM capable of electrically writing/erasing data, otherwise a RAM backed up by a battery (not shown in detail). In other words, the memory 34 is composed of a nonvolatile memory by which even when a power source is turned off, the data previously written into this nonvolatile memory can be held.

Figure 6:
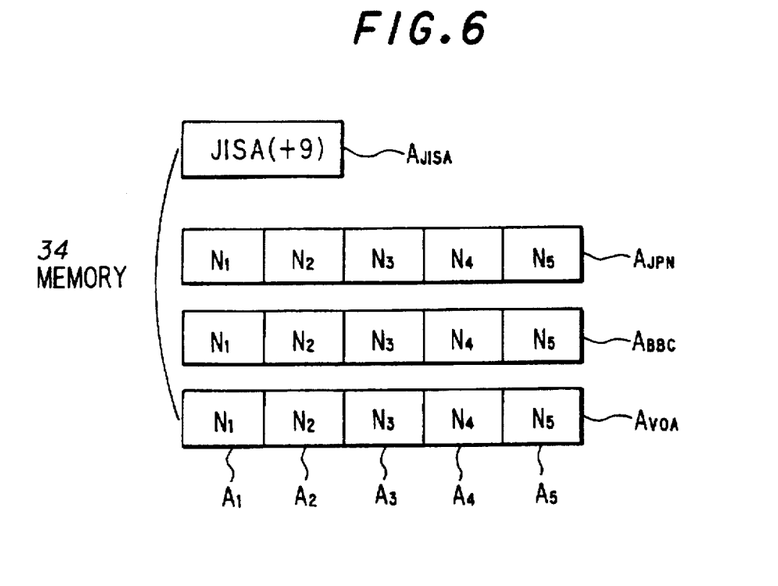
FIG. 6 schematically illustrates a structure of storage areas in a memory.

As represented in FIG. 6, for example, storage areas "AJISA" are provided in the memory 34. Assuming that, for instance, the data JISA (=+9) and PLCNM (=TOKYO) in the time difference table JSTBL are used to display the present time, the time difference data JISA (=+9) is stored in the area AJISA.

Also, as indicated in FIG. 6, a plurality of areas AJPN, ABBC, AVOA are provided in the memory 34 and are used to store the frequency data about the Radio Japan, B.B.C., VOA broadcasting stations, i.e., the frequency dividing ratio N in this embodiment. In this case, these plural areas AJPN, ABBC, AVOA may store five sets of frequency dividing ratio N1 to N5 in each of these areas, and therefore the storage area is subdivided into areas A1 to A5.

Referring back to FIG. 1, a reference numeral 41 indicates an output port, a reference numeral 42 shows an input port, and a reference numeral 43 denotes a key interface circuit. These circuits 41 to 43 are connected through the system bus 39 to the CPU 31. The output port 41 is connected to the frequency dividing circuit 22, so that the frequency dividing ratio N supplied from the CPU 31 is set through this output port 41 to the frequency dividing circuit 22. In addition, the detection signal S51 divided from the detecting circuit 51 is inputted through the input port 42 to the CPU 31.

To the interface circuit 43, a time set key KTS, a station selection key KJPN for the Radio Japan, a stations selection key KBBC for B.B.C., a station selection key KVOA for VOA are connected, and further selection keys K1 to K5 of scan keys K+, K–, "1" to "5" are connected. These keys K1 to K5 are composed of non-locking type push switches.

In FIG. 1, a reference numeral 44 indicates a timer circuit for counting a time elapse on the basis of UTC time or GMT, and this timer circuit 44 is connected through the system bus 39 to the CPU 31. A reference numeral 52 denotes a display for displaying the receiving frequency and the time in a digital form, which is arranged by, for example, a liquid crystal display (LCD) element. The display 52 is connected through a display controller 45 to the system bus 39. A buffer memory 46 for the display data is connected to the controller 45. Under non-operations condition (the radio receiver is turned off) of the radio receiver, the present time, name of place, and time difference data, which have been set in FIG. 4, will be described later, are represented on the display 52. Under operation condition (the radio receiver is turned on) of the radio receiver, information such as the frequency data of the received shortwave broadcasting channel is represented on the display 52.

When the data is written or stored into the memory 46, the stored data is repeatedly read out by the controller 45 to be supplied to the display 52. On this display 52, the time, receiving frequency and the like corresponding to the data stored into the memory 46 are displayed in the digital form.

Figure 7:
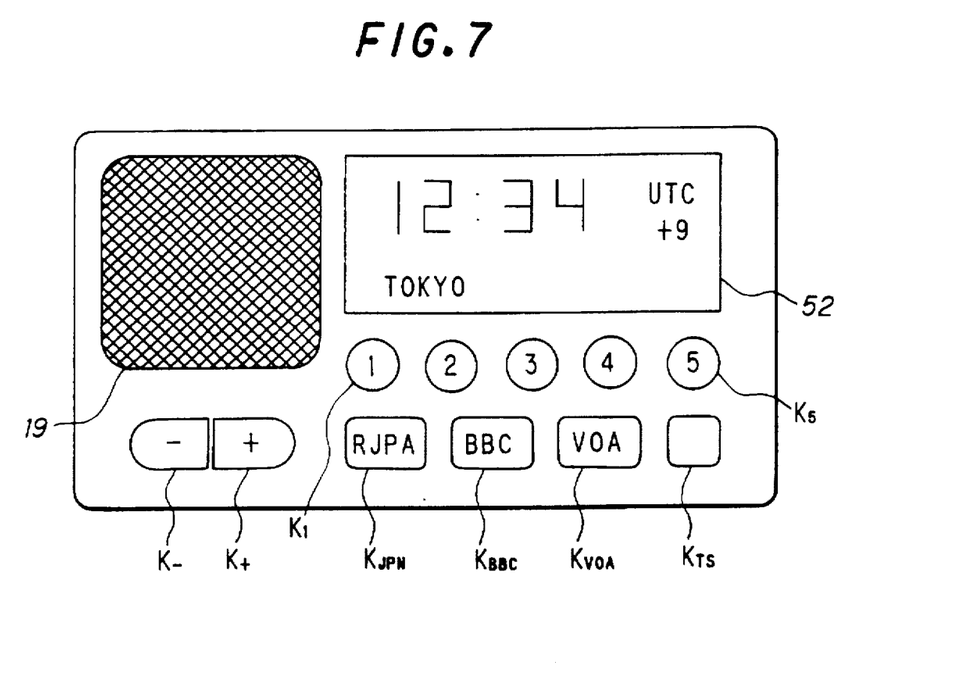
FIG. 7 is a front view of a structure of the radio receiver according to an embodiment of the present invention.

FIG. 7 is a front view for showing an outer appearance of the radio receiver according to this embodiment. The speaker 19, the display 52, and the plural keys K–, K+, K1 to K5, KJPN, KBBC, KVOA and KTS are arranged on one major surface of the main body of the radio receiver. The sound output side of this speaker 19 is protected by using a net-shaped member, not shown.

Operations and data processing are performed in this radio receiver with the above-described arrangement as follows:

DISPLAY OF TIME

A display of time is carried out when a power source switch (not shown in detail) of the radio receiver is turned off. In this state, no power source voltage is supplied to the circuits required to receive shortwave broadcasting programs, but the power source voltage is supplied only to the circuit for displaying the time, such as the timer circuit.

That is, interrupt is established to the CPU 31 by the timer circuit 44 every 1 minute. In other words, under control of the CPU 31, the data about the UTC time counted by the timer circuit 44 is outputted from the timer circuit 44. At the same time, this UTC time data is corrected as the time data about the local time based upon the time difference data JISA stored in the area AJISA of the memory 34 in accordance with, for instance, a method described later. This present time data is supplied to the controller 45 so as to be stored into the memory 46.

In the time difference table JSTBL, the place name data PLCNM written into the data column having the time difference data JISA stored in the area AJISA of the memory 34 is read out. Then, this read place name data PLCNM is supplied to the controller 45, thereby being written into the memory 46.

As a result, as shown in FIG. 7, the place name and the present time of the local place corresponding to this place name are displayed on the display 52 in numeral form.

SELECTION/DISPLAY OF PRESENT TIME IN VARIOUS PLACE

Selections and displays of local times in various places are carried out by depressing either the up key "K+" or the down key "K–", while the time set key KTS is depressed when the power source switch of the radio receiver is turned off. In this case, the power source voltage is being applied to the circuits required to select and display the local times of the various places.

That is, when the key "K+" or the key "K–" is depressed while depressing the time set key KTS, the process operation by the CPU 31 is as shown in FIG. 4 commenced from a step 101 of the routine 100. At the next step 102, the time difference data JISA stored in the area AJISA of the memory 34 is incremented, or decremented by "1" in response to the key operation of the key "K+", or the key "K–". Subsequently, at a step 103, a check is made as to whether or not JISA=13. If JISA=13, then the process operation is advanced from this step 103 to a step 104. At this step 104, the time difference data JISA is set to –11. Thereafter, the process operation is advanced to a step 105. At the step 103, if the time difference data JISA is not equal to 13, then the process operation is advanced from the step 103 to a step 105.

At this step 105, another check is done as to whether or not JISA=–12. When it is so judged JISA=–12, the process operations is advanced from the step 105 to a step 106. At this step 106, the time difference JISA is set to 12. Thereafter, the process operation is advanced to a step 111. At the step 105, to the contrary, when the time difference data JISA is not equal to –12, the process operation is advanced from this step 105 to the step 111.

As described above, the time difference data JISA of the area AJISA is changed in response to the key operation by the key "K+", or "K–".

Then, at the step 111, the present UTC time data is read out from the timer circuit 44, and this read UTC time data is corrected as the local time based on the time difference data JISA of the area AJISA at a step 112. This corrected local time data is written into the memory 46 under control of the controller 45 at a step 113.

Next, at a further step 114, the place name data PLCNM is read out from such a data column having time difference data JISA with a value equal to that of the time difference data JISA of the area AJISA in the time difference table JSTBL. This read place name data PLCNM is written into the memory 46 under control of the controller 45 at a step 115.

Consequently, the display contents of the display 52 are changed from the presently indicated place name and local time thereof into the succeeding or preceding place name and local time thereof in the time difference table JSTBL.

Subsequently, the process operations as defined at the step 115 and thereafter a step 121 and also succeeding steps are executed. As will be described in detail, at the steps subsequent to the step 121, the process operation related to the time display is not performed, but this routine 100 is accomplished.

As a consequence, when either the key "K+" or the key "K−" is depressed while depressing the time set key KTS, the process operations defined from the steps 101 to 115 are repeated. As a result, both the place name and the local time thereof represented on this display 52 are changed along the up direction, or the down direction in accordance with the place name data PLCNM and the time difference data JISA contained in the time difference table JSTBL.

Accordingly, a selection can be made of the desired place name and the local time thereof prepared in the time difference table JSTBL. It should be noted that after this selection, since the above-described "DISPLAY OF TIME" process operation is executed every 1 minute, the resultant place names and local times thereof are displayed on the display 52 at these steps 101 to 115.

As described above, while the time set key KTS is depressed, either the key "K+" or the key "K−" is depressed to display the desired place name on the display 52. Then, the time difference in the place of this place is automatically set, so that the local time of this place can be displayed.

RESET OF BROADCASTING STATION

In the routine 100, the process operation of the CPU 31 is advanced from the step 115 to the step 121. When the process operations defined at the step 121 and the subsequent steps are carried out, the frequency data used to select the desired broadcasting station from the Radio Japan, B.B.C., and VOA broadcasting stations is preset in the storage areas AJPN to AVOA of the memory 34.

That is, when the process operation is advanced to the step 121, a check is done as to whether or not the time difference data JISA stored in the storage area AIJISA of the memory 34 satisfies the following condition:

$$-11 \leq JISA \leq -2$$

If $-11 \leq JISA \leq -2$, then the process operation is advanced from the step 121 to a step 122. At this step 121, the frequency dividing ratios N1 to N5 for the Radio Japan in the frequency table FRQTBL, which have been prepared in the column of the American zone are transferred to the storage areas A1 to A5 of the memory 34, respectively. Further, the frequency dividing ratios N1 to N5 and N1 to N5 for the B.B.C. and VOA broadcasting channels in the frequency table FRQTBL, which have been prepared in the American zone are similarly transferred to the areas A1 to A5, and A1 to A5 of the storage areas ABBC and AVOA in the memory 34. Thereafter, the process operation is advanced to a step 161 at which this routine 100 is ended.

At the step 121, referring to FIGS. 3 and 6, when the time difference data does not satisfy $-11 \leq JISA \leq -2$, the process operation is advanced from the step 121 to the step 131. At this step 131, another check is made as to whether or not the time difference data JISA stored in the area AJISA of the memory 34 satisfies the following condition:

$$6 \leq JISA \leq 12.$$

When $6 \leq JISA \leq 12$, the process operation is advanced from the step 131 to a step 132. At this step 132, the frequency dividing ratios N1 to N5, N1 to N5, and N1 to N5 for the Radio Japan, B.B.C., VOA broadcasting channels, which have been prepared in the Asia/Oceania zone in the frequency table FRQTBL, are similarly transferred to the storage areas AJPN, ABBC, AVOA of the memory 34. Thereafter, this routine 100 is accomplished at a step 161.

Further, at a step 131, when the time difference data does not satisfy $6 \leq JISA \leq 12$, the process operation is advanced from the step 131 to a step 141. At this step 141, another check is done as to whether or not the time difference data JISA stored in the area AJISA of the memory 34 satisfies the following condition:

$$2 \leq JISA \leq 5.$$

When $2 \leq JISA \leq 5$, the process operation is advanced from the step 141 to a step 142. At this step 142, the frequency dividing ratios N1 to N5, N1 to N5, and N1 to N5 for the Radio Japan, B.B.C., VOA broadcasting channels, which have been prepared in the Middle East/East Africa zone in the frequency table FRQTBL, are similarly transferred to the storage areas AJPN, ABBC, AVOA of the memory 34. Thereafter, this routine 100 is accomplished at the step 161.

At the step 141, when the time difference data does not satisfy $2 \leq JISA \leq 5$, the process operation is advanced from the step 141 to a step 152. At this step 152, the frequency dividing ratios N1 to N5, N1 to N5, and N1 to N5 for the Radio Japan, B.B.C., VOA broadcasting channels, which have been prepared in the Europe/West Africa zone in the frequency table FRQTBL, are similarly transferred to the storage areas AJPN, ABBC, AVOA of the memory 34. Thereafter, this routine 100 is accomplished at the step 161.

As a consequence, when the process operation defined at the step 121 and the subsequent steps thereof is executed, the frequency dividing ratios N1 to N5 corresponding to the time difference data JISA stored in the area AJISA of the memory 34 are transferred to the storage areas AJPN, ABBC, AVOA of the memory 34.

In other words, when either the key "K+", or the key "K−" is depressed to represent the desired place name on the display 52 while depressing the time set key KTS, the local time of this desired place is represented, and also the frequency data about the Radio Japan, B.B.C., and VOA broadcasting channels which are receivable in this desired place are set to the storage areas AJPN, ABBC, AVOA of the memory 34. As a consequence, the frequencies receivable in the desired place with respect to the Radio Japan, B.B.C., and VOA broadcasting channels are preset to the selection keys K1 to K5, respectively.

SELECTION OF PRESET BROADCASTING STATION

In this selection operation, when the power source switch of the shortwave radio receiver is turned on to apply the power source voltage to the circuits shown in FIG. 1, the station selection key for the desired shortwave broadcasting station is selected from the station selection keys KJPN to KVOA and is depressed. Thereafter, any one of the selection keys K1 to K5 is depressed.

For instance, when the Radio Japan broadcasting program is received, first, the station selection key KJPN is depressed. Then, since the station selection key KJPN is depressed, the storage area AJPN corresponding to the depressed station selection key KJPN is selected among the storage areas AJPN to AVOA of the memory 34.

Subsequently, for instance, when the selection key K1 is depressed, for frequency dividing ratio N is read out under control of the CPU 31 from the storage area A1 corresponding to the selection key K1 from the storage area AJPN. This frequency dividing ratio N has been set in this storage area A1. This read frequency dividing ratio N is set through the port 41 to the frequency dividing circuit 22 of the PLL circuit 20. Consequently, the Radio Japan broadcasting program having such a frequency preset to the selection key K1 is selected from the Radio Japan broadcasting programs selected by the station selection key KJPN.

Also, when the selection key K1 is depressed and thereafter, for example, the selection key K2 is depressed, the frequency dividing ratio N which has been set in a storage area A2 corresponding to the depressed selection key k2 among the storage areas AJPN, is read out and then set into the frequency dividing circuit 22. Consequently, after the Radio Japan broadcasting station has been selected by the station selection key KJPN, if any one of the selection keys K1 to K5 is depressed, then the Radio Japan broadcasting program having the frequency preset in this depressed selection key is selected.

Furthermore, in other cases that the B.B.C., broadcasting program or the VOA broadcasting program is received, if either the station selection key KBBC or the station selection key KVOA is depressed and also the selection keys K1 to K5, then the B.B.C., broadcasting station, or VOA broadcasting station having the frequency preset in the depressed selection key is selectable from the B.B.C., or VOA broadcasting stations selected by the station selection key KBBC, or KVOA.

Consequently, the Radio Japan, B.B.C., or VOA broadcasting stations can be selected by depressing the station selection keys KJPN, KBBC, KVOA, and also the broadcasting programs with the frequencies can be received under better program receiving conditions by depressing the selection keys K1 to K5.

SCANNING RECEPTION OF SHORTWAVE BROADCASTING CHANNEL

A scanning reception of shortwave broadcasting channels is carried out in such a manner that either the up key "K+" or the down key "K-" is depressed when the power switch of the radio receiver is turned on.

That is, when the key "K+", or the key "K-" is depressed, the frequency dividing ratio N of the frequency dividing circuit 22 is incremented, or decremented by "1" in accordance with the key operation of the key "K+" or the key "K-" under control of the CPU 31. It should be noted that if the incremented, or decremented frequency dividing ratio N would be deviated from the maximum frequency dividing ratio of 6090, or the minimum frequency dividing ratio of 550, then this incremented or decremented frequency dividing ratio N would be recognized as the maximum value or the minimum value.

As a consequence, when the key "K+", or the key "K-" is depressed, the receiving frequency f12 is incremented, or decremented by 5 kHz.

When the receiving frequency f12 is changed in this manner, the detection signal S51 is checked at each 5 kHz-step of this changed receiving frequency f12, so that such a checking operation can be done as to whether or not the broadcasting program is received. As described above, when no broadcasting program is received, the receiving frequency f12 is continuously changed. However, when it is detectable that a certain broadcasting program is received at a certain receiving frequency f12, the increment or decrement operation of the frequency dividing ratio "N" is interrupted in the subsequent process operation.

As a result, the receiving frequency f12 is varied in an interval of 5 kHz until a desired broadcasting program is received, upon reception of this desired broadcasting program, the receiving condition of this desired broadcasting program is subsequently continued. In other words, the scanning operation is carried out.

OTHER RECEPTION

In case that the shortwave broadcasting service area is subdivided into the northern hemispherical zone and the southern hemispherical zone, both the place name data PLCNM and the time difference data JISA thereof about the typical areas within the northern hemispherical zone and the southern hemispherical zone are prepared in the time difference table JSTBL. In addition, such data capable of indicating which zone these place name data PLCNM and time difference data JISA correspond to are prepared, for instance, serial numbers for the place name data PLCNM. Then, the relevant zone may be discriminated based on this serial number.

Also, another data indicative of broadcasting time is prepared in the frequency table FRQTBL. When the power source is turned on, the proper frequency dividing ratios N1 to N5 to the present time may be transferred to the storage areas AJPN to AVOA of the memory 34 based on the present time and this broadcasting time.

What is claimed is:

1. A radio receiver comprising:

an antenna for receiving a broadcast signal;

a tuning circuit for tuning the broadcast signal received by the antenna and outputting a tuned signal of a desired frequency;

an amplifier for amplifying the tuned signal from the tuning circuit and outputting an amplified signal;

a phase-locked loop circuit having a variable frequency dividing circuit for variably converting a frequency of the amplified signal by changing a frequency dividing ratio of the frequency dividing circuit;

mixer means for mixing the amplified signal and an oscillator signal from the phase-locked loop and outputting an intermediate frequency signal;

an AM detector for demodulating the intermediate frequency signal and outputting the demodulated signal to a speaker;

storage means for storing a radio broadcasting service area subdivided into a plurality of areas based upon a time difference between the local time of the plurality of areas and Greenwich standard time and frequency data for each of the plurality of areas;

timer means for setting local time; and control means for reading frequency data from the storage means based on the time difference between the local time set by the timer means and Greenwich standard time and setting the frequency dividing ratio of the phase-locked loop circuit based on the frequency data.

2. A radio receiver according to claim 1, wherein the storage means comprises a first storage unit for storing place name data corresponding to the time difference between the local time of the plurality of areas and Greenwich standard time and a second storage unit for storing frequency data for an area indicated by the place name data stored in the first storage unit, and the control means changes the frequency dividing ratio of the variable frequency dividing circuit based on the frequency data from the second storage unit.

3. A radio receiver according to claim 2, further comprising display means for displaying the local time set by the timer means and the place name data read from the first storage unit for a non-operating condition of the radio receiver, and for displaying data indicative of a receiving frequency for an operating condition of the radio receiver.

4. A radio receiver according to claim 3, wherein the control means corrects the local time set by the timer means based on the time difference stored in the first storage unit and displays the corrected local time.

5. A radio receiver comprising:

an antenna for receiving a broadcast signal;

a tuning circuit for tuning the broadcast signal from the antenna and outputting a tuned signal of a desired frequency;

an amplifier for amplifying the tuned signal from the tuning circuit and outputting an amplified signal;

a phase-locked loop circuit having a variable frequency dividing circuit for variably converting a frequency of the amplified signal by changing a frequency dividing ratio of the frequency dividing circuit, an oscillator circuit for outputting a reference frequency, a comparator circuit for comparing the reference frequency and a converted frequency from the variable frequency dividing circuit and supplying a comparison signal to a low pass filter, the low pass filter outputting a channel selecting voltage to the tuning circuit and a control voltage to a voltage-controlled oscillator;

storage means for storing a radio broadcasting service area subdivided into a plurality of areas based upon a time difference between the local time of the plurality of areas and Greenwich standard time and frequency data for each of the plurality of areas;

timer means for setting local time; and control means for reading frequency data from the storage means based upon the time difference between the local time set by the timer means and Greenwich standard time and for setting the frequency dividing ratio of the phase-locked loop circuit based on the frequency data;

mixer means for mixing the amplified signal from the amplifier circuit and an oscillator signal from the voltage-controlled oscillator and outputting an intermediate frequency signal; and an AM detector for demodulating the intermediate frequency signal and outputting the demodulated signal to a speaker.

6. A radio receiver according to claim 5, wherein the storage means comprises a first storage unit for storing place name data corresponding to the time difference between the local time of the plurality of areas and Greenwich standard time and a second storage unit for storing frequency data for an area indicated by the place name data stored in the first storage unit, and the control means changes the frequency dividing ratio of the variable frequency dividing circuit based on the frequency data from the second storage unit.

7. A radio receiver according to claim 6, further comprising display means for displaying the local time set by the timer means and the place name data read from the first storage unit for a non-operating condition of the radio receiver, and for displaying data indicative of a receiving frequency for an operating condition of the radio receiver.

8. A radio receiver according to claim 7, wherein the control means corrects the local time set by the timer means based on the time difference stored in the first storage unit and displays the corrected local time.

* * * * *